Aug. 26, 1958 W. R. KEARNEY ET AL 2,848,899

MANUALLY LOADED SIGNAL SEEKING TUNER

Filed May 23, 1955 2 Sheets-Sheet 1

INVENTORS
William R. Kearney &
Manfred G. Wright
BY R. E. Fowler
ATTORNEY

Aug. 26, 1958 W. R. KEARNEY ET AL 2,848,899

MANUALLY LOADED SIGNAL SEEKING TUNER

Filed May 23, 1955 2 Sheets-Sheet 2

INVENTORS
William R. Kearney &
Manfred G. Wright
BY
R. E. Fowler
ATTORNEY

United States Patent Office 2,848,899

Patented Aug. 26, 1958

2,848,899

MANUALLY LOADED SIGNAL SEEKING TUNER

William R. Kearney and Manfred G. Wright, Kokomo, Ind., assignors to General Motors Corporation, Detroit, Mich., a corporation of Delaware Application May 23, 1955, Serial No. 510,088

8 Claims. (Cl. 74—10.2)

This invention relates to means for tuning radio apparatus and more particularly to automatic indexing means for driving the tuning means to scan the frequency spectrum and to stop the tuning means upon receipt of a transmitted signal. Apparatus of this nature is commonly known as "stop-on-signal" radio tuning means or "signal seeking" tuning means. Signal seeking tuning means currently on the market include power means for moving the tuning means in both directions across the band. One form utilizes a biased spring drive to move the tuning means in one direction across the band during the selection of stations and a solenoid controlled by limit switches to reload the spring when it has reached one extremity of its range of travel. During scanning by said spring drive the tuning means may be stopped upon receipt of an incoming signal in the apparatus by the operation of a relay. The driving means for the tuner and particularly the recharging solenoid is a relatively large portion of the total cost of the tuning section of the apparatus. In an effort to reduce the total cost of such driving means for a tuning mechanism, it would be advantageous to eliminate the solenoid portion.

It is therefore an object in making this invention to provide automatic tuning means including resilient power means for radio receivers which is manually loaded to scan the band.

It is a further object in making this invention to provide automatic tuning means for radio receivers which may be moved in either direction to power a resilient drive or to move to a point adjacent a desired station, thus providing tuning means which may be quickly brought into the proximity of a known station.

Figure 1:
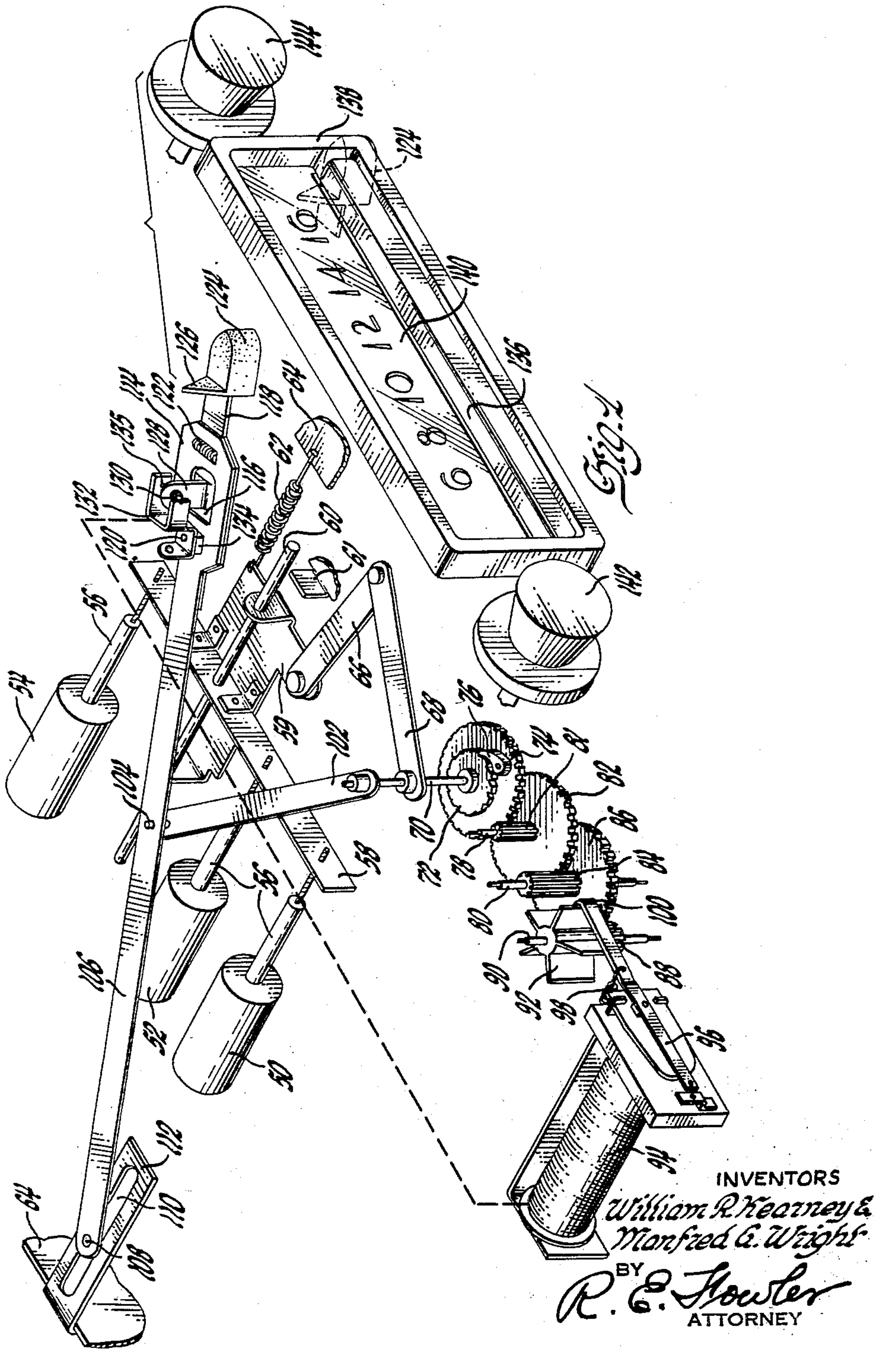
Figure 2:
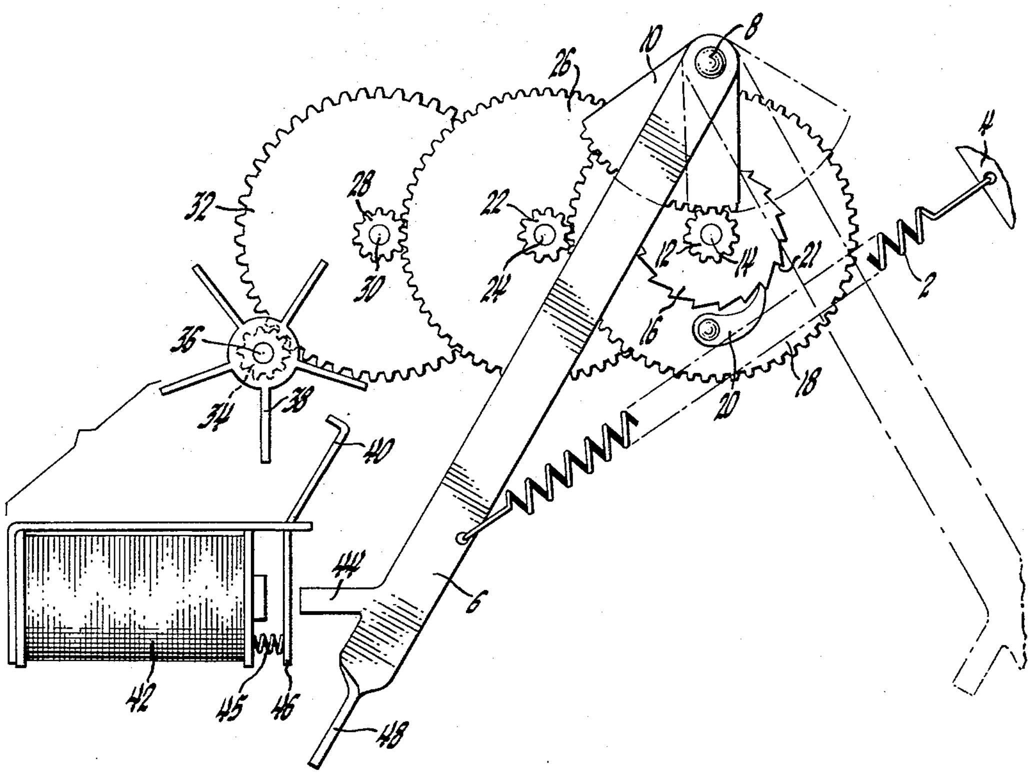

With these and other objects in view which will become apparent as the specification proceeds, our invention will be best understood by reference to the following specification and claims and the illustrations in the accompanying drawings, in which:

Figure 1 is a schematic diagram of automatic tuning means embodying my invention; and Figure 2 is a similar schematic diagram illustrating the principle of a spring drive with a manual loading feature.

As previously mentioned, in an effort to reduce the complexity and cost of radio tuning means, the resilient spring motor which is used to cause the tuner to scan the band is powered or loaded manually. Figure 2 shows the general scheme in which a spring 2 having one end fastened to an anchor 4 on the frame and the opposite end connected to a pivoted lever 6 biases the lever for rotation in a counterclockwise direction about its pivot 8. Secured to the pivot 8 and rotatable therewith is a sector gear 10. The sector gear in turn meshes with a small pinion 12 mounted on a shaft 14 which likewise carries a ratchet gear 16 fixedly mounted thereon. Rotatably mounted freely on said shaft 14 is a large gear 18 which carries a pivoted pawl 20 so mounted as to engage the teeth 21 of the ratchet wheel 16. When the ratchet wheel rotates in a clockwise direction, as seen in Figure 2, the pawl 20 engages the teeth 21 and causes the gear 18 to which it is attached to rotate in a clockwise direction. When the ratchet gear 16 is turned in the opposite direction, the pawl will slip over the teeth and the gear 18 will remain stationary.

The gear 18 meshes with a pinion 22 affixed to a shaft 24 which also carries a multiplying gear 26. Gear 26 engages or meshes with a third pinion 28 affixed to shaft 30, which likewise carries a last large gear 32. Thus from the pinion 14 a multiplying action is derived to gear 32. The gear 32 meshes with a small pinion 34 on shaft 36 which carries an air vane governor 38 to dampen the speed of rotation. The air van governor, besides acting as a damping member for the rotation of the gear train formed of the above items, likewise acts as a locking member when it is engaged by a detent arm 40 of the control relay 42. This control relay is actuated by the signal seeking circuit such as shown in patent 2,652,494 to Guyton, and is deenergized when the receiver is on station. The lever 6 also has a depending finger 44 which is adapted to engage with portion 46 of the detent arm 40 which extends adjacent the relay core and compress spring 45.

In the operation of this type of mechanism, the operator grasps the extending end 48 of the lever 6 and moves it to the left. This movement loads the driving spring 2 and causes arm 44 to engage extension 46, moving the detent 40 out of engagement with the air vane governor 28, permitting the gear train to rotate. As soon as movement occurs the relay 42 will be energized to hold the detent out of the way. The spring 2 tends to move the pivoted arm 6 back toward the right and in doing so drives the pinion 12 in a clockwise direction and, through the ratchet and pawl drive, the remainder of the gear train to the air vane governor which regulates the speed at which the gear train may be driven. The tuning means, of course, is operably connected to the gear train by any suitable means and is moved over the band as the gear train rotates. When a station is encountered, relay 42 is deenergized to move detent 40 into engagement with one of the arms of the air vane governor 38 and stops the receiver. Figure 2 thus illustrates the general principle utilized in the present invention of manually loading the driving spring motor of a signal seeking tuner.

Referring now more particularly to Figure 1, the various parts of a radio tuner are shown in spaced interconnected relation. The antenna, RF, and oscillator coils shown at 50, 52 and 54 are tuned across the proper band by the insertion or withdrawal of their associated cores 56, which are commonly mounted on a transverse crossbar 58. Said crossbar 58 and its carriage 59 are mounted for movement on a rod 60 which extends parallel to the cores. As the bar 58 therefore moves along the rod 60, the tuning of the set will be varied. The carriage 59, which is rigidly attached to the transverse bar 58, is biased toward the front of the set by a driving spring 62, one end of said spring being attached to a portion of the frame 64 and the other end to the carriage 59. Thus the spring 62 will tend to move the carriage 59 and its associated tuning means toward the front of the receiver until it engages limit stop 61. The carriage 59 has connected to one portion thereof a pivoted link 66 which is likewise pivoted to a second similar link 68 having its opposite end connected to a driven shaft 70. As the carriage 59 moves back and forth, the links 66 and 68 imparts a rotary movement to said shaft 70. A ratchet wheel 72 is fixedly mounted on shaft 70 and rotates therewith. A second gear 74 is freely rotatably mounted on shaft 70 adjacent to the ratchet gear 72 and carries a pivoted pawl 76, spring biased to engage the teeth of the ratchet wheel 72. When the shaft 70 is rotated in a clockwise direction, looking downwardly thereon, the pawl 76 will engage the teeth of the ratchet 72 and drive the gear 74 upon which the pawl is mounted.

The gear 74 drives an associated gear train consisting of the gears mounted on two spaced shafts 78 and 80, respectively carrying pinion 81, gear 82 and pinion 84, gear 86, rigidly connected thereto. The gear 74 meshes with the pinion 81 which drives gear 82 meshing with pinion 84, the latter driving gear 86. The gear 86 drives a last pinion 88 mounted on a further shaft 90 and affixed thereto to drive said shaft. Also mounted on shaft 90 is an air vane governor 92 which rotates as a result of this gear train drive. An indexing relay 94 is mounted adjacent the air vane governor and its armature 96 is pivoted about its center and spring biased by spring 98 to pull the detent end 100 into the path of the air vane governor. When the relay is energized the armature 96 is pivoted to pull the detent away from the path of the air vanes and stretch the spring 98.

There is also connected to the rotatable shaft 70 a further link 102. This link is fixedly secured to the shaft 70 to rotate therewith. Its opposite end is pivotally connected at point 104 to the lever 106. The rear end of the lever 106 is provided with a downwardly depending pin 108 which rides in a guiding slot 110 in a bracket 112 carried by the frame. The forward end of the lever 106 is broadened at 114 and has a central slot 116 therein. Pivotally mounted to the under surface of the forward end of the lever 106 is a member 118 pivotally connected by pin 120. Both the forward end of the lever 106 and the adjacent portion of the member 118 have aligned openings therein in which is mounted a spiral spring 122 which tends to keep the two members in alignment, but which will permit relative motion of one member with respect to the other.

The forward end of the member 118 extends beyond the lever 106 and has mounted thereon a manually engageable knob 124 which carries an upstanding indicator portion 126. The member 118 has secured thereto an upstanding tab 128 which projects through the opening 116 in the forward end of the lever 106. This tab carries on opposite faces contact switch points such as 130. A U-shaped bracket 132 insulatably mounted on an insulating block 134 on top of the lever 106 has its extending angular arms on each side of the upper end of the tab 128. Thus when the member 118 is moved in either direction with respect to the forward end of the lever 106, contact may be completed between one of the contact members 130 and contact members 135 on the bracket 132 to control the relay 94. The forward end of the lever assembly including member 118 is adapted to project through a slot 136 in the escutcheon plate 138 which supports the dial 140. There is also provided adjacent the dial, a knob 142 which may operate the off-on switch and volume control and a second knob 144 on the opposite end of the dial which may operate the radio receiver sensitivity control.

The switches formed by the contacts 130–135 are included in the control circuit for the relay 94, and when either set of contacts are closed, the relay will be energized, thus releasing the detent 100 from the governor and starting signal seeking action. As before mentioned, the relay is controlled by a signal seeking control circuit which cuts off conduction through a tube connected to the relay, thus deenergizing the same when a station is tuned in, as shown in the previously mentioned Patent No. 2,652,494, in the name of James H. Guyton, for Signal Seeking Tuner.

In the operation of the present system, the operator grasps the extending member 124 and moves it slightly to the right. This causes relative motion between contacts 130 and 135 on the right-hand side and completes a circuit to energize the relay 94, as shown in the patent. This lifts the detent 100 away from engagement with the fly fan and the gear train may now rotate. The spring 62 pulls the carriage forward, withdrawing the cores 56 from their associated coils to vary the tuning of the receiver. This movement also turns the gear 74 in a clockwise direction as shown in Figure 1, which simultaneously drives the remainder of the gear train and its associated air vane governor. This action also moves the lever 106 further to the right and the indicating member 126 travels over the dial.

When a station is encountered, relay 94 is deenergized, as described in the above-mentioned Guyton patent, and detent 100 is drawn into engagement with the air vane governor 92 to immediately stop the tuning variation. This scanning action continues until the lever 106 is moved completely to the right to the end of the scale, at which time the operator grasps the manual member 124 and moves the lever toward the low frequency end of the band, which action, simultaneously, through the linkage system, moves the tuning cores back into their associated coils and loads or cocks the driving spring 62. This action also closes the switch 130–135 on the left-hand side to energize the relay 94, but causes no practical result inasmuch as there is no driving force applied to gear 74 at this time. At any point the operator desires to release the manual member 124, the mechanism will start tuning over the band at once, since the relay 94 is energized by the action of moving the manual member to the left.

If a station has just been passed, for example if the tuner is at approximately 1200 kc. and it is desired to return to a station whose frequency is 1130, the operator may move the control lever to the left far enough until it reaches a position just to the left of the frequency of the station desired, i. e., 1120. This simultaneously closes an energizing circuit for the relay 94 so that when the lever 106 is released, the spring 62 may drive to move the lever 106 again to the right, encountering the station desired. This type of control system has the advantage that it can be quickly moved to various parts of the dial without the necessity of going through a complete cycle of operation.

We claim:

1. In radio receiving apparatus, adjustable means for tuning the apparatus over a predetermined band of frequencies, movable means upon which the adjustable means is mounted, resilient means connected to the movable means to tend to move it in one direction, a gear train operatively connected to said movable means and driven by movement thereof, one-way drive means in the gear train so that the movable means may be moved in one direction without driving the train, indexing means driven by the gear train, magnetic control means engageable with the indexing means to lock the gear train, and manually movable pivotally mounted means link coupled to the first-named movable means to move the latter within the range and to load the resilient means.

2. In radio receiving apparatus, adjustable means for tuning the apparatus over a predetermined band of frequencies, movable means upon which the adjustable means is mounted, resilient means connected to the movable means to tend to move it in one direction, a gear train operatively connected to said movable means and driven by movement thereof, one-way drive means in the gear train so that the movable means may be moved in one direction without driving the train, indexing means driven by the gear train, magnetic control means engageable with the indexing means to lock the gear train, manually movable pivotally mounted means link coupled to the first-named movable means to move the latter within the range and to load the resilient means, and switching means on said manually movable means electrically connected to the magnetic means to control the same for controlling the indexing means.

3. In radio receiving apparatus, adjustable tuning means, a carriage upon which the tuning means is mounted, spring biasing means connected to said carriage to move it in one direction, manually movable pivotally mounted means link and rotary shaft coupling means interconnecting the manually movable pivotally mounted means and said carriage to move the same against the spring means to load the same, a gear train connected to said rotary shaft coupling and driven by rotation of the same to act as a load when the carriage is driven by the spring, and governor means driven by said gear train to limit its speed.

4. In radio receiving apparatus, adjustable tuning means, a carriage upon which the tuning means is mounted, spring biasing means connected to said carriage to move it in one direction, manually movable pivotally mounted means link coupled to said carriage to move the same against the spring means to load the same, a gear train operatively connected to said carriage to be driven by movement of the same and to act as a load when the carriage is driven by the spring, governor means driven by said gear train to limit its speed, indexing means engageable with said governor means to stop said carriage and switching means on said manually movable means electrically connected to said indexing means for controlling the same when the manual means is moved.

5. In radio receiving apparatus, adjustable tuning means, a carriage upon which the tuning means is mounted, spring biasing means connected to said carriage to move it in one direction, a manually movable lever operably connected to said carriage to move the same and load the spring, said lever comprising two parts relatively movable to a limited degree with respect to each other, switch means mounted on each part and engageable upon any relative movement, and magnetic indexing means operatively connected to said carriage to stop the same at certain positions and electrically connected with said switch means, said indexing means being controlled by said switch means.

6. In radio receiving apparatus, adjustable tuning means, a carriage upon which the tuning means is mounted, spring biasing means connected to said carriage to move it in one direction, a manually movable lever operably connected to said carriage to move the same and load the spring, said lever comprising two parts relatively movable to a limited degree with respect to each other, switch means mounted on each part and engageable upon any relative movement, a gear train load including a one-way drive operatively connected to said carriage to limit the speed of travel of said carriage when driven by the spring, a governor driven by said gear train and magnetic indexing means engageable with the governor to stop the carriage and electrically connected with said switch means, said magnetic means being controlled by the switch means.

7. In radio apparatus, movable means for tuning the apparatus over a predetermined band of frequency, a pivoted assembly operably connected to the movable tuning means for moving the latter, said assembly consisting of a plurality of parts pivotally connected together but capable of relative pivotal movement, spring biasing means engaging said parts to maintain the parts in a desired relationship but providing for said relative movement, magnetic indexing means operatively engageable with said movable means for the tuning apparatus to control movement of the same and switching means electrically connected to the magnetic indexing means to control the same carried by the parts and operable upon relative motion of said parts to perform a control function.

8. In radio apparatus, movable means for tuning the apparatus over a predetermined band of frequencies, resilient means connected to the movable means to bias the same for movement in one direction, a pivotally supported lever assembly operably connected to said movable means to move the latter in opposition to the resilient bias, said lever assembly consisting of a plurality of parts pivotally connected together but capable of relative pivotal movement and having aligned openings therein, spring means located within the openings to maintain the parts in a desired relationship but to provide for said relative motion, magnetic indexing means operatively engageable with said movable means for tuning the apparatus to control movement of the same, switching means electrically connected to the magnetic indexing means to control the same carried by the parts and operable upon relative motion of the same and manually engageable means on one of said parts so that upon the application of manual pressure on the latter part to move the same relative motion of the parts will be produced, the switching means will be actuated and the load on the resilient means varied.

References Cited in the file of this patent

UNITED STATES PATENTS

| | | |
|---|---|---|
| 2,701,330 | Schwarz et al. | Feb. 1, 1955 |
| 2,743,620 | Schwarz et al. | May 1, 1956 |